United States Patent
Male et al.

(10) Patent No.: US 12,237,247 B2
(45) Date of Patent: Feb. 25, 2025

(54) SEMICONDUCTOR PACKAGE WITH TOP CIRCUIT AND AN IC WITH A GAP OVER THE IC

(71) Applicant: Texas Instruments Incorporated, Dallas, TX (US)

(72) Inventors: Barry Jon Male, West Granby, CT (US); Paul Merle Emerson, Madison, AL (US); Sandeep Shylaja Krishnan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/527,457

(22) Filed: Dec. 4, 2023

(65) Prior Publication Data

US 2024/0096761 A1 Mar. 21, 2024

Related U.S. Application Data

(62) Division of application No. 17/698,855, filed on Mar. 18, 2022, now Pat. No. 11,837,529, which is a (Continued)

(51) Int. Cl.
*H01L 23/495* (2006.01)
*H01L 21/56* (2006.01)
(Continued)

(52) U.S. Cl.
CPC ...... *H01L 23/49513* (2013.01); *H01L 21/563* (2013.01); *H01L 21/565* (2013.01);
(Continued)

(58) Field of Classification Search
CPC ............... H01L 23/49548; H01L 24/32; H01L 23/3107; H01L 24/17; H01L 24/49; H01L 24/16; H01L 24/33; H01L 24/29; H01L 21/565; H01L 23/49575; H01L 21/563; H01L 23/49805; H01L 24/73; H01L 24/09; H01L 23/3114; H01L 23/4952; H01L 23/49513; H01L 24/05; H01L 24/13; H01L 23/642; H01L 24/83; H01L 24/48; H01L 23/3121; H01L 23/315; H01L 23/49541; H01L 23/49531; H01L 23/10; H01L 23/041; H01L 23/04; H01L 24/01;
(Continued)

(56) References Cited

U.S. PATENT DOCUMENTS 5,523,628 A 6/1996 Williams et al.
6,100,594 A 8/2000 Fukui et al.
(Continued)

*Primary Examiner* — Mouloucoulaye Inoussa
(74) *Attorney, Agent, or Firm* — Frank D. Cimino

(57) ABSTRACT

A packaged integrated circuit (IC) includes a leadframe including a die pad. The packaged IC also includes a first circuit on the die pad, the first circuit having a region. The packaged IC also includes a second circuit on the first circuit, the second circuit being spaced from the region by a gap. The packaged IC also includes an attachment layer between the first and second circuits, the attachment layer and the first and second circuits enclosing at least a part of the gap over the region. The packaged IC also includes a mold compound encapsulating the first and second circuits, the attachment layer, and the at least part of the gap.

20 Claims, 3 Drawing Sheets

Related U.S. Application Data division of application No. 16/202,925, filed on Nov. 28, 2018, now Pat. No. 11,302,611.

(51) Int. Cl.
*H01L 23/00* (2006.01)
*H01L 23/31* (2006.01)

(52) U.S. Cl.
CPC ...... *H01L 23/3114* (2013.01); *H01L 23/4952* (2013.01); *H01L 23/49548* (2013.01); *H01L 24/09* (2013.01); *H01L 24/17* (2013.01); *H01L 24/32* (2013.01); *H01L 24/49* (2013.01); *H01L 24/73* (2013.01); *H01L 2924/1304* (2013.01); *H01L 2924/141* (2013.01)

(58) Field of Classification Search
CPC ............ H01L 123/562; H01L 23/4334; H01L 23/4951; H01L 23/3135; H01L 2224/32265; H01L 2224/83893; H01L 2224/73203; H01L 2224/32245; H01L 2224/4912; H01L 2224/32145; H01L 2924/1304; H01L 2224/33181; H01L 2224/73265; H01L 2224/04042; H01L 2224/32058; H01L 2224/0401; H01L 2224/16145; H01L 2224/29191; H01L 2224/13025; H01L 2224/16265; H01L 2224/49175; H01L 2224/48247; H01L 2224/73215; H01L 2224/48464; H01L 2924/181; H01L 2224/29011; H01L 2224/73207; H01L 2224/48265; H01L 2224/73253; H01L 2224/48091; H01L 2924/00012; H01L 2924/00014; H01L 2924/10155; H01L 2924/15151; H01L 2224/48145; B81B 7/02; B81B 7/0058; B81B 7/007; B81B 7/0061; B81B 7/008; B81B 7/0048; B81B 7/0054; B81B 2201/0264; B81B 2201/0292; B81B 2207/094; B81B 2207/012; B81B 2203/0127; B81B 2201/0257; B81B 2207/07; B81B 2207/99; G08B 7/02; G01L 19/0092; G01N 27/223; B81C 1/00269; B81C 1/00325; B81C 2203/0118; B81C 2203/0792; B81C 2203/0154; B81C 2203/0136; H04R 1/04; H04R 19/04; H04R 19/005; H04R 31/006; H04R 31/00; H04R 1/06; H04R 2499/11; H04R 2201/003

See application file for complete search history.

(56) References Cited

U.S. PATENT DOCUMENTS

| | | |
|---|---|---|
| 6,316,838 B1 | 11/2001 | Ozawa et al. |
| 6,323,550 B1 | 11/2001 | Martin et al. |
| 6,415,505 B1 | 7/2002 | Glenn |
| 6,455,927 B1 | 9/2002 | Glenn et al. |
| 6,522,015 B1 | 2/2003 | Glenn et al. |
| 6,530,515 B1 | 3/2003 | Glenn et al. |
| 6,555,917 B1 | 4/2003 | Heo |
| 6,624,921 B1 | 9/2003 | Glenn et al. |
| 6,630,515 B2 | 10/2003 | Cruz et al. |
| 6,638,789 B1 | 10/2003 | Glenn et al. |
| 6,777,789 B1 | 8/2004 | Glenn et al. |
| 6,810,736 B2 | 11/2004 | Ikezawa et al. |
| 6,876,068 B1 | 4/2005 | Lee et al. |
| 7,213,465 B2 | 5/2007 | Benzel et al. |
| 7,419,853 B2 | 9/2008 | Kuhmann et al. |
| 7,507,603 B1 | 3/2009 | Berry et al. |
| 7,572,659 B2 | 8/2009 | Tsubaki et al. |
| 7,723,852 B1 | 5/2010 | Kim et al. |
| 7,732,899 B1 | 6/2010 | Berry et al. |
| 8,686,547 B1* | 4/2014 | Kao ........................ H01L 24/73 |
| | | 257/676 |
| 9,321,628 B2 | 4/2016 | Faralli et al. |
| 10,014,810 B1 | 7/2018 | Michallick et al. |
| 10,065,851 B2 | 9/2018 | Bryzek |
| 10,243,570 B1 | 3/2019 | Forey et al. |
| 2002/0008309 A1 | 1/2002 | Akiyama |
| 2002/0163015 A1 | 11/2002 | Lee et al. |
| 2003/0177831 A1 | 9/2003 | Ikezawa et al. |
| 2004/0183170 A1 | 9/2004 | Tomimatsu |
| 2004/0251531 A1 | 12/2004 | Yang et al. |
| 2005/0082490 A1 | 4/2005 | Perillat |
| 2005/0186703 A1 | 8/2005 | Weiblen et al. |
| 2005/0253240 A1 | 11/2005 | Nuechter et al. |
| 2005/0258336 A1 | 11/2005 | Chen |
| 2005/0275077 A1 | 12/2005 | Tan et al. |
| 2005/0280127 A1 | 12/2005 | Zhao et al. |
| 2005/0285239 A1 | 12/2005 | Tsai et al. |
| 2006/0005624 A1 | 1/2006 | Hirano |
| 2006/0097331 A1 | 5/2006 | Hattori et al. |
| 2006/0140287 A1 | 6/2006 | Alon et al. |
| 2006/0201708 A1 | 9/2006 | Hsu |
| 2006/0208326 A1 | 9/2006 | Nasiri et al. |
| 2007/0001298 A1 | 1/2007 | Ozawa et al. |
| 2007/0044557 A1 | 3/2007 | Takemasa et al. |
| 2007/0080757 A1 | 4/2007 | Yahata et al. |
| 2007/0158826 A1 | 7/2007 | Sakakibara et al. |
| 2007/0176807 A1 | 8/2007 | Mattes et al. |
| 2007/0290364 A1 | 12/2007 | Gupta et al. |
| 2008/0006939 A1 | 1/2008 | Logan et al. |
| 2008/0029907 A1 | 2/2008 | Koduri |
| 2008/0197485 A1 | 8/2008 | Theuss et al. |
| 2008/0211089 A1 | 9/2008 | Khan et al. |
| 2008/0217708 A1 | 9/2008 | Reisner et al. |
| 2008/0250859 A1 | 10/2008 | Nakatani |
| 2008/0303124 A1 | 12/2008 | Khan et al. |
| 2008/0315333 A1 | 12/2008 | Combi et al. |
| 2009/0079274 A1 | 3/2009 | Cases et al. |
| 2009/0236751 A1 | 9/2009 | Chin et al. |
| 2010/0164082 A1 | 7/2010 | Fujisawa |
| 2011/0079905 A1 | 4/2011 | Sanchez et al. |
| 2011/0121413 A1 | 5/2011 | Allen et al. |
| 2011/0187005 A1* | 8/2011 | Pagaila ................. H01L 23/315 |
| | | 257/777 |
| 2012/0027234 A1 | 2/2012 | Goida |
| 2012/0049300 A1 | 3/2012 | Yamaguchi et al. |
| 2012/0049355 A1 | 3/2012 | Hosokawa et al. |
| 2012/0079882 A1 | 4/2012 | Chiba et al. |
| 2012/0133061 A1 | 5/2012 | Mitsukura et al. |
| 2012/0280335 A1 | 11/2012 | Zoellin et al. |
| 2012/0299170 A1 | 11/2012 | Kehrer et al. |
| 2013/0079068 A1 | 3/2013 | Coffy et al. |
| 2013/0187723 A1 | 7/2013 | Harima et al. |
| 2013/0195284 A1 | 8/2013 | Yang et al. |
| 2013/0241013 A1 | 9/2013 | Yamanaka et al. |
| 2013/0313700 A1 | 11/2013 | Hooper et al. |
| 2014/0254851 A1 | 9/2014 | Chen |
| 2014/0291785 A1 | 10/2014 | Kasai et al. |
| 2014/0291829 A1 | 10/2014 | Neel et al. |
| 2014/0361387 A1 | 12/2014 | Meyer et al. |
| 2015/0001651 A1 | 1/2015 | Faralli et al. |
| 2015/0146894 A1 | 5/2015 | Ng |
| 2015/0171066 A1 | 6/2015 | Yamamichi et al. |
| 2015/0200180 A1 | 7/2015 | Fam et al. |
| 2015/0227155 A1 | 8/2015 | Manea et al. |
| 2015/0263184 A1 | 9/2015 | Takai et al. |
| 2015/0274515 A1 | 10/2015 | Bowles et al. |
| 2015/0280785 A1 | 10/2015 | Brauchler et al. |
| 2015/0381121 A1 | 12/2015 | Jones et al. |
| 2016/0090298 A1 | 3/2016 | Sengupta et al. |
| 2016/0148879 A1 | 5/2016 | Saxod et al. |
| 2016/0225734 A1 | 8/2016 | Veches et al. |
| 2016/0285418 A1 | 9/2016 | Jones et al. |
| 2016/0285420 A1 | 9/2016 | Jones |
| 2016/0344353 A1 | 11/2016 | Watts et al. |
| 2016/0347606 A1 | 12/2016 | Bruno et al. |

(56) References Cited

U.S. PATENT DOCUMENTS

| | | |
|---|---|---|
| 2016/0359456 A1 | 12/2016 | Zhang et al. |
| 2017/0006368 A1 | 1/2017 | Brioschi et al. |
| 2017/0038263 A1 | 2/2017 | Fury et al. |
| 2017/0085228 A1 | 3/2017 | Abdo et al. |
| 2017/0086272 A1 | 3/2017 | O'Neil et al. |
| 2017/0154913 A1 | 6/2017 | Jun |
| 2017/0197823 A1 | 7/2017 | Wachtler et al. |
| 2018/0239415 A1 | 8/2018 | Bogue et al. |
| 2018/0269272 A1 | 9/2018 | Cook et al. |
| 2019/0064204 A1 | 2/2019 | Matsuzawa |
| 2019/0141426 A1 | 5/2019 | Brioschi et al. |
| 2019/0356274 A1 | 11/2019 | Zhu et al. |
| 2020/0043828 A1 | 2/2020 | Smeys et al. |
| 2021/0090940 A1 | 3/2021 | Wachtler et al. |
| 2022/0028657 A1 | 1/2022 | Nitta |

\* cited by examiner

SEMICONDUCTOR PACKAGE WITH TOP CIRCUIT AND AN IC WITH A GAP OVER THE IC

REFERENCE TO RELATED APPLICATION

This application is a division of U.S. patent application Ser. No. 17/698,855, filed Mar. 18, 2022, which is a division of U.S. patent application Ser. No. 16/202,925, filed Nov. 28, 2018, now U.S. Pat. No. 11,302,611. The entirety of the above reference applications are hereby incorporated by reference.

FIELD

This Disclosure relates to plastic packaged semiconductor devices that include an analog integrated circuit (IC) stacked with another circuit or circuit element.

BACKGROUND

There are several precision analog IC types, including analog ICs that include a voltage reference circuit. ICs having voltage reference circuits are designed so that their output voltage is stable. This is accomplished with circuit topologies and physical semiconductor (e.g., silicon) layouts that minimize their output voltage sensitivity to temperature, and by employing packaging methods that attempt to minimize output voltage variations from package induced stress to the voltage reference circuit. There are three common types of voltage reference circuits, charged capacitor, zener, and bandgap, with the most common voltage reference circuit type being a bandgap voltage reference.

A bandgap voltage reference circuit is commonly used in mixed-signal ICs such as for analog-to-digital converters (ADCs) and digital-to-analog converters (DACs), for producing a fixed (or essentially constant) DC voltage independent of power supply variations, temperature changes, and loading. A bandgap voltage reference is known to be the combination of a bipolar (or diode) base-emitter junction voltage (Vbe) and a proportional to absolute temperature (PTAT) voltage. The Vbe for a silicon diode is roughly 650 mV at room temperature, and the Vbe has a negative temperature coefficient (TC).

The mechanical stresses from the packaging material (e.g., the mold compound) can affect the precision achieved in many analog and mixed signal circuits. For example, for ADCs a non-linearity change over temperature, for amplifiers a change in the offset voltage, offset drift or gain variation, and for voltage references, a voltage drift or degradation in long term voltage stability.

The attempt to minimize output variations from package induced stress is somewhat ineffective for plastic molded IC packages. This is primarily because the mold compound material impinges on stress sensitive regions of the voltage reference circuit in a non-uniform and unpredictable manner. Pressure from the mold material for example can introduce a piezoelectric effect on the bandgap voltage reference circuit that can shift the Vbe for bipolar devices or the threshold voltage for metal oxide semiconductor (MOS) devices, as well as the PTAT voltage (ΔVbe) for a bandgap voltage reference circuit.

For improving noise performance voltage reference circuits typically include an external filter capacitor(s) that is part of an RC low pass network. The filter capacitor is typically provided on a printed circuit board (PCB). This filter capacitor typically connects to a high impedance circuit node on the IC. Output voltage shifts of the reference voltage circuit can occur due to PCB surface leakage and/or dielectric leakage from the filter capacitor (e.g., through its dielectric) which can become a significant customer issue unless high performance filter capacitors are used and a biased guard ring encircles the high impedance node(s) on the IC.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure recognizes that it would be desirable to have a plastic packaged IC arrangement that has an analog IC that includes stress sensitive circuitry (e.g., a voltage reference circuit) which isolates the stress from the mold compound from reaching the stress sensitive circuitry on the IC, and integrates another circuit referred to herein as a second circuit that can be a filter capacitor in the case of an IC including a voltage reference circuit into the package, and where leakage susceptible nodes on the analog IC are not exposed to the environment. As used herein, an analog IC includes ICs having only an analog function, as well as IC's having a mixed-signal function such as DACs and ADCs.

A fundamental disclosed aspect is a single additional structure provided as the second circuit that is conventionally outside the packaged IC generally on a PCB that is instead inside of the plastic package which solves the issue of performance inaccuracies of stress sensitive circuitry such as voltage reference circuits on the IC that can be introduced due to the stress from the mold material. The second circuit also provides an active or a passive circuit (e.g., a filter capacitor(s) for a noise filter), that due to the stacked arrangement which minimizes parasitics, renders the packaged IC also essentially immune to the electrical leakage issues experienced by PCB mounted discrete components.

Disclosed aspects include a packaged IC comprising a leadframe including a die pad and leads around the die pad, an analog IC die having first bond pads on its active top side. A second circuit including second circuit bond pads is attached to the analog IC by an attachment layer configured as a ring with a hollow center that provides an inner gap. A bottom side of the analog IC or a bottom side of the second circuit is attached to the die pad. Bond wires couple at least some of the first bond pads or some of the second circuit bond pads to the leads, and there is a second coupling between others of the second circuit bond pads and others of the first bond pads. A mold compound is for encapsulating the second circuit and the analog IC.

BRIEF DESCRIPTION OF THE DRAWINGS

Reference will now be made to the accompanying drawings, which are not necessarily drawn to scale, wherein.

DETAILED DESCRIPTION

Figure 1A:
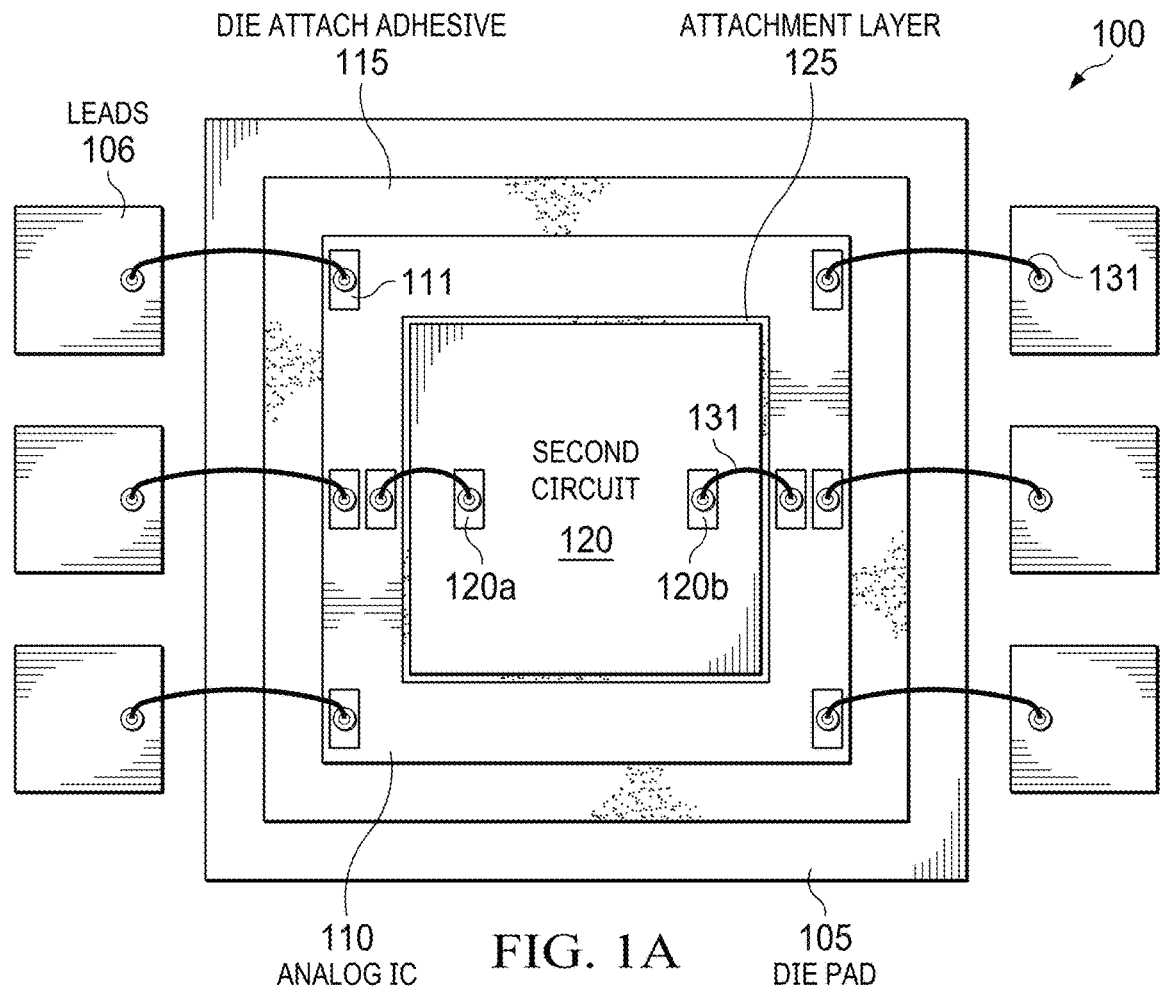
FIG. 1A is a top perspective view depiction of an example packaged IC comprising an analog IC including sensitive circuitry and a dual-function second circuit as a top circuit attached to a top surface of the analog IC with a gap over the analog IC, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

This Disclosure includes packaged semiconductor devices including an analog IC (e.g., having a voltage reference circuit) and a second circuit (e.g., a large area high capacitance density filter capacitor) attached to an analog IC with a gap over the stress sensitive circuitry of the analog IC. The area of the second circuit can be less than the area of the analog IC die, or more than the area of the analog IC. The second circuit provides a dual-function by isolating the stress sensitive regions on the surface of the analog IC die 110 from stress resulting from the mold compound, and also provides a circuit function such as a low pass filter for filtering noise signals in the voltage reference output without the inherent leakage current errors that would be experienced if these circuit nodes where to be conventionally coupled to a filter capacitor on a PCB. The substrate of the analog IC and the substrate of the second circuit can be matched, such as both comprising silicon, so that their coefficient of thermal expansion (CTE) can be essentially identical, which avoids the CTE induced stress into the analog IC due to the second circuit.

FIG. 1A is a top perspective view depiction of an example packaged IC 100 comprising an analog IC die (analog IC) 110 and a dual-function second circuit 120 with second circuit bond pads attached by an attachment layer 125 to a top surface of the analog IC 110. The packaged IC 100 comprises a leadframe including a die pad 105 and leads 106 around the die pad 105 that the analog IC 110 is mounted on with a die attach adhesive 115. Although not shown, the leads 106 can be on all 4 sides of the package. The disclosed integration of the second circuit 120 within the package avoids problems such as output voltage inaccuracy due to PCB leakage in the case the analog IC 110 includes a voltage reference circuit and the system design conventionally includes a filter capacitor on a PCB.

The second circuit 120 is shown including second circuit bond pads 120a, 120b shown attached to the top side of the analog IC die 110 by the attachment layer 125. The second circuit 120 can comprise a silicon, glass, ceramic, or an alumina substrate. The attachment layer 125 generally occupies 2% to 20% of an area of the top one of the second circuit 120 (as shown in FIG. 1A) and analog IC 110 (see FIG. 2C described below). The second circuit 120 can comprise an active circuit including transistor(s), or a passive circuit such as an inductor or filter capacitor.

The attachment layer 125 can generally be any attachment arrangement with a gap that provides a mechanical bond. The attachment layer 125 is formed in a ring with an inner gap (see gap 126 in FIG. 2A described below) that can comprise a printable low modulus die attach material, such as DOW 7920 which comprises polydimethylsiloxane and silica, where the gap creates an open cavity stress-free region over a portion of the analog IC 110. Although the packaged IC 100 includes an encapsulating mold compound (see the mold compound 220 in FIG. 2A described below), the mold compound is not shown in FIG. 1A to avoid obscuring package IC 100 features. Moreover, although the second circuit 120 is shown having a planar bottom side, the second circuit 120 can also have a back side cavity that can increase the distance between the back side of the second circuit 120 over the cavity and the top side of the analog IC 110.

The attachment layer 125 configured as a ring having an inner gap generally can comprise a printable low modulus elastomer, a glass-to-glass peripheral fusion or anodic bond, where the attachment layer 125 secures the second circuit 120 to the analog IC 110 top side up or with a flip chip arrangement with solder balls or solder capped pillars. The electrical connections between the second circuit bond pads 120a and 120b of the second circuit 120 and the first bond pads 111 on the analog IC 110 can comprise conventional wire bonding for the second circuit 120 top side up arrangement as shown as bond wires 131 in FIGS. 1A and 1n FIG. 2A described below, or a flipchip attachment for the second circuit 120 with solder ball 127 connections or solder tipped pillars that also functions as a mechanical attachment shown in FIG. 1B and FIG. 2B described below. The electrical connections between the first bond pads 111 on the analog IC 110 and the leads 106 can also comprise bond wires 131.

The analog IC 110 can comprise a relatively sensitive circuit such as a clock generator, an ADC, a DAC, an operational amplifier, or a sensor. In the case of a sensor, for example, a hall sensor on the analog IC 110 needs to be essentially free of stress to minimize offset errors. In applications where external magnetic flux is accurately measured by nulling at the hall sensor with a bucking coil, where the coil current at null is a representation of the external flux magnitude, the second circuit 120 can be a bucking coil/inductor.

Other sensors that can benefit from disclosed aspects include anisotropic magneto resistor types as well as temperature sensors. The IC may have needed stable performance of for example −50 ppm or less from thermal hysteresis, high-temperature operating life (HTOL), and temperature coefficient (TC) lumped together. Normally the unpackaged electrical circuit may have a "pure" TC just due to the circuit design. That TC may be trimmed (e.g., laser trimmed) to a very small number. Packaging stress adds additional TC to the device. That TC is also "mixed" with thermal hysteresis because the materials that are mechanically stressed are hysteretic in that they may mechanically relax with repeated thermal excursions. The second circuit 120 is generally an IC die (e.g., silicon die) that can comprise an active circuit including at least one transistor, and/or passive circuitry such as at least one capacitor, inductor, or resistor.

Figure 1B:
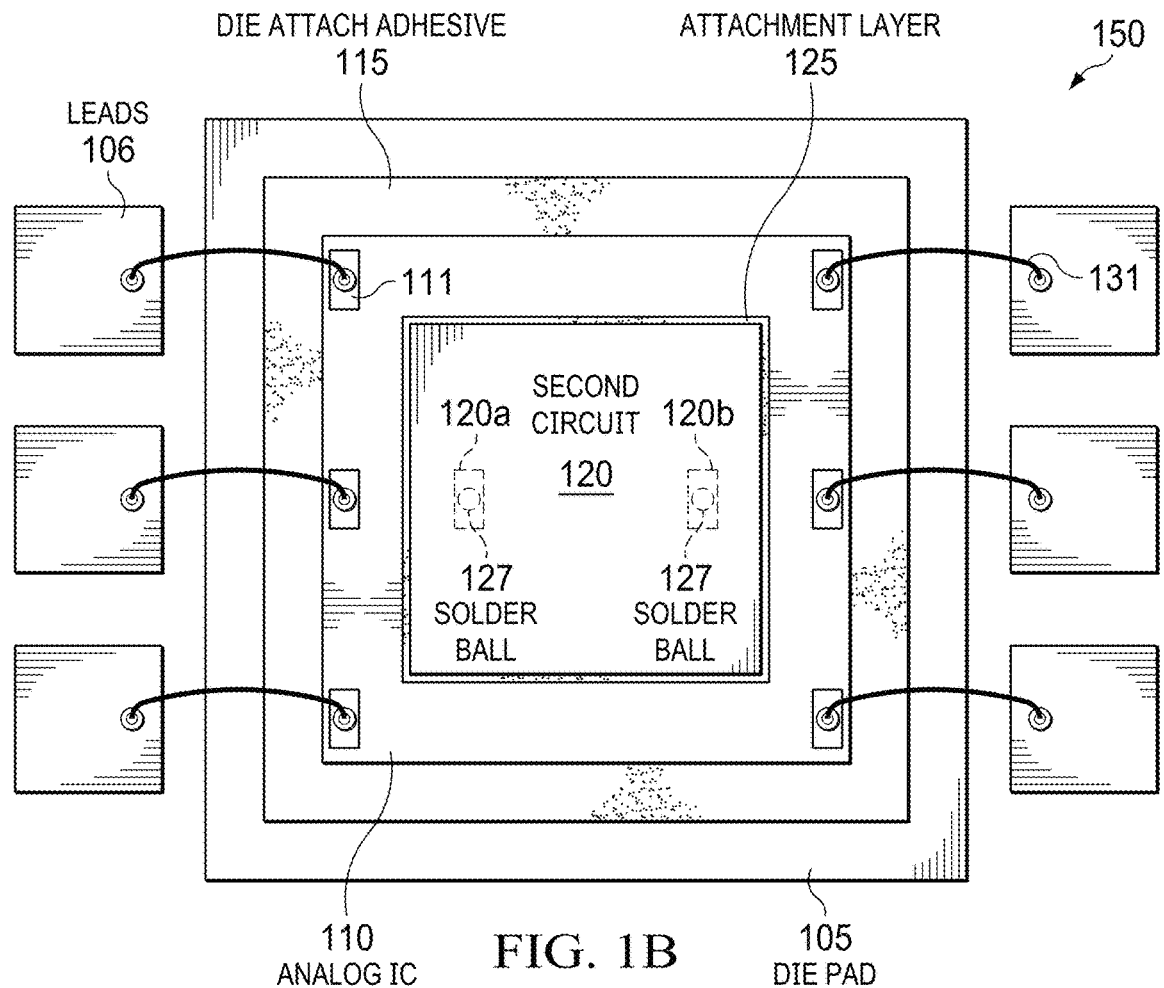
FIG. 1B is a top perspective view depiction of an example packaged IC comprising an analog IC including sensitive circuitry such as a voltage reference circuit and a dual-function second circuit attached to a top surface of the analog IC with a gap over the analog IC, where the second circuit is flipchip attached to the analog IC, according to an example aspect.

FIG. 1B is a top perspective view depiction of an example packaged IC 150 comprising an analog IC 110 including sensitive circuitry such as a voltage reference circuit and a dual-function second circuit 120 attached to a top surface of the analog IC 110 with a gap (see gap 126 in FIG. 2B described below) over the analog IC. The second circuit bond pads 120a, 120b of the second circuit 120 are flipchip attached by solder balls 127 to some of the first bond pads 111 on the analog IC 110 (see FIG. 2B). The solder balls 127 are generally in the gap provided by the attachment layer 125 and spaced away from attachment layer 125. Solder balls 127 can be replaced by solder capped pillars.

Figure 2A:
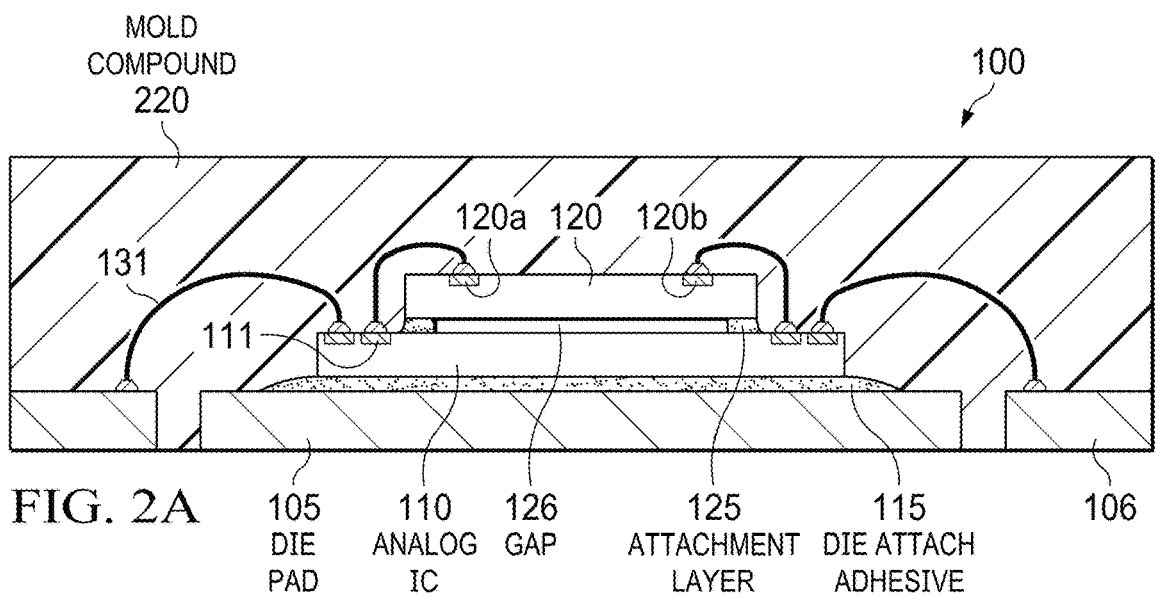
FIG. 2A is a cross sectional depiction of the packaged IC shown in FIG. 1A, according to an example aspect.

FIG. 2A is a cross sectional depiction of the packaged IC 100 shown in FIG. 1A, according to an example aspect. Mold compound is shown as 220. The attachment layer 125 provides an open center gap 126 which acts as a mold barrier during molding to enable being free of mold compound 220 that is between the sensitive surface circuit regions of the analog IC 110 and the second circuit 120. This essentially eliminates the effect of mold compound 220 surface stress on the analog IC 110 having the gap 126 because the gap 126 provides a low stress environment for the portion of the analog IC 110 with the gap 126 thereover. This arrangement is analogous to a relatively costly open cavity ceramic package.

Figure 2B:
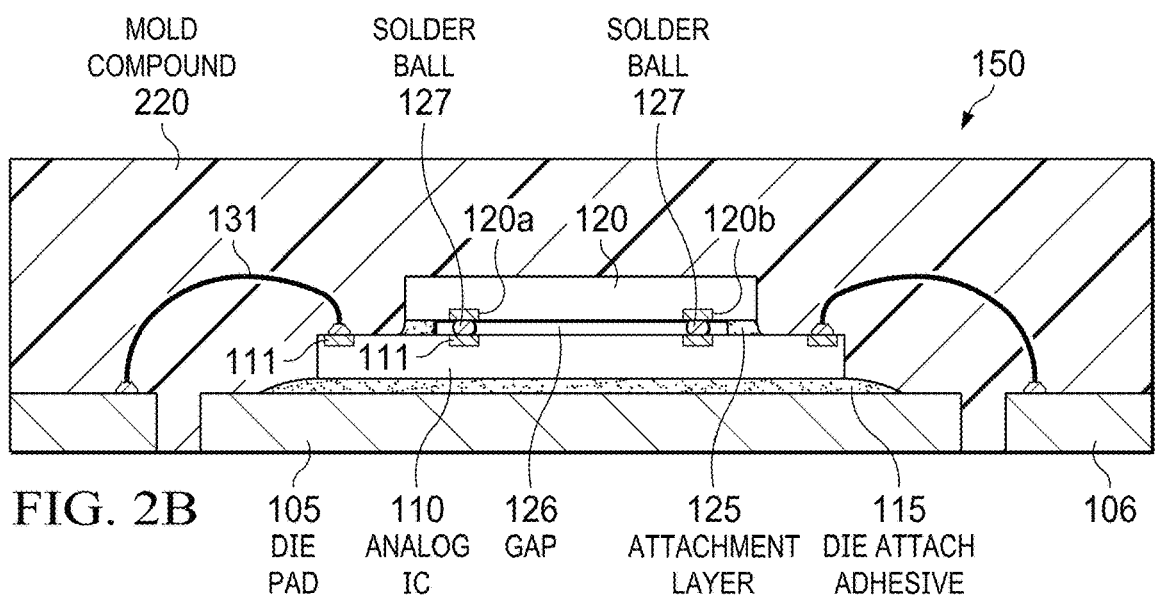
FIG. 2B is a cross sectional depiction of a packaged IC shown in FIG. 1B that has the filter capacitor flipchip attached to bond pads on the IC, according to an example aspect.

FIG. 2B is a cross sectional depiction of a packaged IC 150 shown in FIG. 1B that has the second circuit bond pads 120a, 120b of the second circuit 120 flipchip attached by solder balls 127 to some of the first bond pads 111 on the analog IC 110, according to an example aspect. Packaged IC 150 also creates an environment for the analog IC 110 over the gap 126 that is similar to an open cavity ceramic package.

Another arrangement can combine aspects shown in FIG. 2A and FIG. 2B by having a disclosed top circuit that includes through silicon vias (TSVs) to provide the interconnect to connect to the first bond pads 111 on the analog IC 110. In this arrangement there are solder balls or solder capped pillars to make the die-to-die connection as in a flipchip arrangement, but where the second circuit would be top side up, not flipped. In such a configuration, there can be a combination of wire bonds (to make connections to the leadframe) and solder balls or pillars to connect the TSVs to bond pads on the analog IC 110.

Figure 2C:
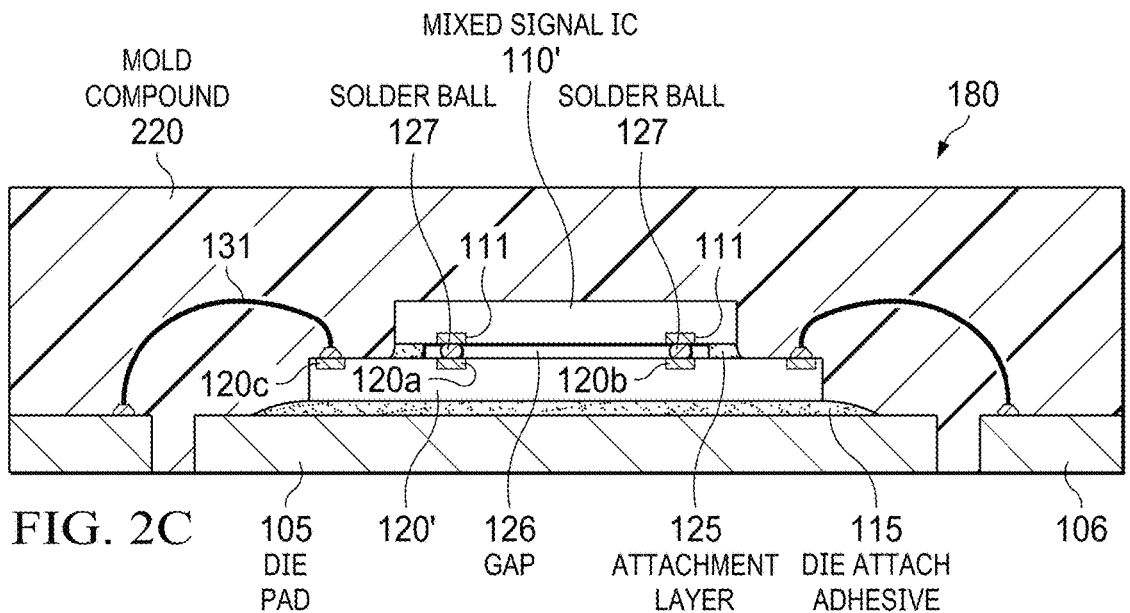
FIG. 2C shows yet another packaged IC arrangement where the top circuit is shown as an analog IC that contains a stress sensitive component comprising a sensitive circuit or sensor, and the bottom die on the die pad is an analog or mixed signal circuit that interfaces with the stress sensitive component.

FIG. 2C shows yet another packaged IC 180 arrangement where the top circuit is shown as a mixed signal IC 110' contains a stress sensitive component comprising a sensitive circuit or sensor, and the bottom die on the die pad 105 is an second circuit 120' that comprises an analog or mixed signal circuit that interfaces with the stress sensitive component. This arrangement involves a flip chip configuration. An air gap is created between the bottom die shown as second circuit 120' and the top die being mixed signal IC 110' that is flipchip die attached which serves as a stress buffer for the stress sensitive component on the mixed signal IC 110'. In this arrangement, the second circuit 120' being the bottom die can also be a larger sized passive element, that is physically larger than the mixed signal IC 110' that has the sensitive circuit being protected. The second circuit 120' has second circuit bond pads 120a, 120b and 120c, where the first bond pads 111 of the mixed signal IC 110' are attached by the solder balls to the second circuit bond pads 120a and 120b, and the second circuit bond pads 120c are bonded by bond wires 131 to the leads 106.

This Disclosure also includes a semiconductor assembly method described for the case the second circuit is on top of the analog IC that comprises providing a leadframe (generally provided as a LF sheet) including a die pad and leads around the die pad, an analog IC die 110 having first bond pads 111 on its active top side with its bottom side attached to the die pad. A second circuit 120 with second circuit bond pads 120a is attached to the active top side of the analog IC die's first bond pads 111 by solder balls 127 or pillars and held in place by an attachment layer 125 that is configured (e.g., a printed elastomer) as a ring with a hollow center providing an inner gap 126. Bond wires are added for coupling at least some of the bond pads 111 to the leads 106. The second circuit 120 and IC die 110 are encapsulated (e.g., using injection molding) by molding a mold compound, wherein the attachment layer 125 prevents the mold compound from entering the gap 126.

Figure 3:
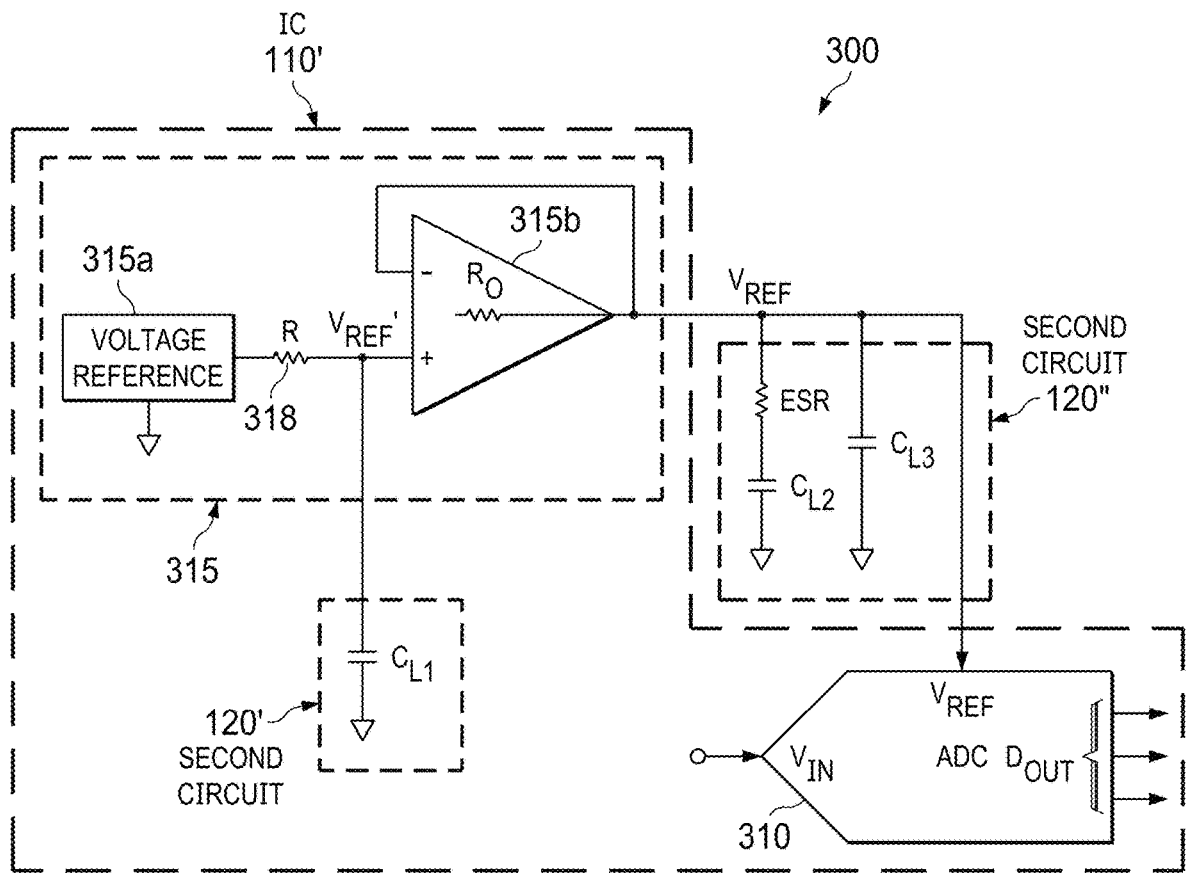
FIG. 3 shows an example mixed signal stacked die device including sensitive circuitry shown as a mixed signal IC comprising successive-approximation-register (SAR) ADC with a voltage reference circuit which generates a reference voltage output V REF that has a dual-function second circuit shown as filter capacitors coupled for low pass filtering the voltage reference circuit's reference voltage output that is attached to the mixed signal IC with a gap over the mixed signal IC.

FIG. 3 shows an example mixed signal stacked die device 300 that includes sensitive circuitry shown as a mixed signal IC 110' comprising a SAR ADC 310 with a voltage reference circuit 315 comprising a voltage reference generator 315a that is known to be sensitive circuitry which provides a pre-buffered reference voltage output ($V_{REF'}$) that is coupled to a buffer 315b (with its output resistance shown as $R_O$) which provides a buffered output shown as $V_{REF}$ that is used as an input by the SAR ADC 310 (shown as a $V_{REF}$ input). There is a dual-function second circuit 120' comprising at least one filter capacitor shown as $C_{L1}$ which together with a resistor shown as R 318 generally on the voltage reference circuit 315 provides a low pass filter for filtering the output from the voltage reference generator 315a to provide $V_{REF'}$. R 318 is generally a high value resistance (e.g., several k ohms to several giga ohms) that makes the circuit sensitive to DC leakage, particularly in conventional arrangements (not shown) where $C_{L1}$ is external.

The $V_{REF}$ output from the buffer 315b is also shown low pass filtered by filter capacitors shown as $C_{L2}$ and $C_{L3}$ hooked in parallel that together with their associated equivalent series resistance (ESR) provide low pass filtering for $V_{REF}$. Filter capacitors $C_{L2}$ and $C_{L3}$ along with the resistor shown as ESR are part of another disclosed second circuit shown as 120".

For a disclosed packaged device for the mixed signal stacked die device 300, the arrangement can follow the packaged IC 100 in FIG. 1A or the packaged IC 150 in FIG. 1B described above, where the attachment layer 125 secures the second circuit 120' and second circuit 120" to the top of the mixed signal IC 110' that provides a gap 126 which would be over the voltage reference circuit 315. The gap 126 being free of mold compound in the packaged IC formed between the voltage reference circuit 315 of the mixed signal IC 110' and the second circuits 120', 120" creates a low stress environment for the voltage reference circuit 315, similar to a costly open cavity ceramic package. Although the second circuits 120' and 120" are described above both being on top of the voltage reference circuit 315, one or both of the second circuits 120', 120" can cover the SAR ADC 310, as both of these circuits are generally stress sensitive.

In operation, the SAR ADC 310 converts an analog input voltage received shown as Vin to a digital code shown only by example for simplicity as a 3 bit digital output (shown as Dout). The overall mixed signal IC 300 accuracy and repeatability depend on how effectively the SAR ADC 310 executes this conversion process. The ADC's 310 actual transfer function has an offset-voltage error and a gain error. The ADC's 310 output code is directly proportional to the Vin level and inversely proportional to the combination of the Vref value plus the gain error. The DC shift of the voltage reference generator 315a inversely impacts the gain accuracy of the ADC 310, which is minimized by the gap 126 within the attachment layer 125 that secures the second circuit 120' to the top of the mixed signal IC 110' being over the voltage reference circuit 315, along with minimizing the parasitic s due to the second circuit 120' being within the package with the mixed signal IC 110' as opposed to conventionally being mounted on a PCB.

Applied to ICs with reference voltage circuits, for a given voltage reference circuit topology, compared to conventional arrangements having filter capacitors on the PCB, disclosed packaged ICs having filter capacitor(s) within the package provides a lower reference voltage shift due to mainly reduced parasitics, lower sensitivity to humidity changes due to the gap being absent of hydroscopic mold compound, less thermal hysteresis as the gap helps the Δ CTE, as well as better long term Vref stability because the stress induced by the package mold compound changes over time. Initially this is due to additional curing of the mold compound, but also there is relaxation of stress with thermal cycling. Soldering vaporizes moisture absorbed in the hydroscopic material, shifting its stress. Soldering is in itself a thermal hysteresis cycle which changes stress. Attachment to the PCB adds an additional stress due to CTE mismatch of the PCB coupled to the IC via the mold compound and leadframe. Disclosed arrangements for reference circuits also provide higher Vref accuracy by avoiding errors due to PCB leakage.

Disclosed aspects can be integrated into a variety of assembly flows to form a variety of different packaged IC devices and related products. The assembly can comprise single semiconductor die or multiple semiconductor die configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A packaged integrated circuit (IC), comprising:
a leadframe including a die pad;
a first circuit on the die pad, the first circuit having a region;
a second circuit on the first circuit, the second circuit being spaced from the region by a gap;
interconnects coupled between the first and second circuit;
an attachment layer between the first and second circuits, the attachment layer and the first and second circuits enclosing at least a part of the gap over the region, the attachment layer being spaced from the interconnects, and
a mold compound encapsulating the first and second circuits, the attachment layer, and the at least a part of the gap.

2. The packaged IC of claim 1, wherein the region is spaced from the interconnects and from the attachment layer.

3. The packaged IC of claim 2, wherein the interconnects include at least one of solder balls, solder capped pillars, or bond wires.

4. The packaged IC of claim 1, wherein the second circuit is flip-chip mounted on the first circuit.

5. The packaged IC of claim 1, wherein the first circuit includes at least one of: a clock generator, an analog-to-digital converter (ADC), a digital-to-analog converter (DAC), an operational amplifier, a voltage reference circuit, a Hall sensor, or a temperature sensor in the region.

6. The packaged IC of claim 1, wherein the first circuit includes a voltage reference circuit, and wherein the second circuit includes at least one filter capacitor that is coupled for low pass filtering an output from the voltage reference circuit.

7. The packaged IC of claim 1, wherein the attachment layer includes a printed elastomer layer that occupies 2% to 20% of an area of the second circuit.

8. The packaged IC of claim 1, wherein the attachment layer is configured to hold the first and second circuits in place.

9. The packaged IC of claim 1, further comprising bond wires coupled between pads of the first circuit and leads of the leadframe.

10. The packaged IC of claim 1, wherein the region is a stress sensitive region, and the at least part of the gap enclosed by the attachment layer and the first and second circuits is configured to provide a stress buffer.

11. A packaged integrated circuit (IC), comprising:
a leadframe including a die pad;
a first circuit on the die pad, the first circuit having a stress sensitive region;
a second circuit on the first circuit, the second circuit being spaced from the stress sensitive region being spaced from by a gap;
interconnects coupled between the first and second circuit; and
an attachment layer between the first and second circuits, the attachment layer being spaced from the interconnects.

12. The packaged IC of claim 11, wherein the stress sensitive region is spaced from the interconnects.

13. The packaged IC of claim 12, wherein the interconnects include at least one of solder balls, solder capped pillars, or bond wires.

14. The packaged IC of claim 11, wherein the second circuit is flip-chip mounted on the first circuit.

15. The packaged IC of claim 11, further comprising a mold compound encapsulating the first and second circuits, the attachment layer, and at least a part of the gap.

16. The packaged IC of claim 11, wherein the attachment layer includes a printed elastomer layer that occupies 2% to 20% of an area of the second circuit.

17. The packaged IC of claim 11, wherein the attachment layer is configured to hold the first and second circuits in place.

18. The packaged IC of claim 11, wherein the first circuit includes at least one of: a clock generator, an analog-to-digital converter (ADC), a digital-to-analog converter (DAC), an operational amplifier, a voltage reference circuit, a Hall sensor, or a temperature sensor in the stress sensitive region.

19. The packaged IC of claim 11, wherein the first circuit includes a voltage reference circuit, and wherein the second circuit includes at least one filter capacitor that is coupled for low pass filtering an output from the voltage reference circuit.

20. The packaged IC of claim 11, further comprising bond wires coupled between pads of the first circuit and leads of the leadframe.

\* \* \* \* \*